United States Patent [19]

Tanaka et al.

[11] Patent Number: 5,480,861
[45] Date of Patent: Jan. 2, 1996

[54] LAYERED STRUCTURE COMPRISING INSULATOR THIN FILM AND OXIDE SUPERCONDUCTOR THIN FILM

[75] Inventors: So Tanaka; Michitomo Iiyama, both of Osaka, Japan

[73] Assignee: Sumitomo Electric Industries Ltd., Osaka, Japan

[21] Appl. No.: 274,781

[22] Filed: Jul. 14, 1994

[30] Foreign Application Priority Data

Jul. 14, 1993 [JP] Japan ..................... 5-196810

[51] Int. Cl.⁶ .................. H01B 12/00; H01L 29/06; B05D 5/12
[52] U.S. Cl. .................. 505/236; 505/193; 505/237; 505/239; 257/35; 257/39; 427/62; 427/63
[58] Field of Search .................. 257/35, 36–39; 505/191–193, 233, 234, 237, 238, 239; 427/62, 63

[56] References Cited

U.S. PATENT DOCUMENTS 5,324,714  6/1994  Inam et al. .................. 257/35

FOREIGN PATENT DOCUMENTS 414881   1/1992  Japan .................. 257/35
4111482  4/1992  Japan .................. 257/35

OTHER PUBLICATIONS

Chien et al, "Effect of Noble Metal Buffer Layers on Superconducting YbaCuO Thin Films," Appl. Phys. Lett. vol. 51, No. 25, 21 Dec. 1987, pp. 2155–2157.

Fujii et al, "Metal–Insulator Field–Effect–Transistor Using $SiTiO_3$/YBaCuO Heteroepitaxial Films," Jp. J. App. Phys., vol. 31, Part 2;, No. 5B, 15 May 1992, pp. L612–L615.

*Primary Examiner*—Mahshid Saadat
*Attorney, Agent, or Firm*—Kerkam, Stowell, Kondracki & Clarke; John C. Kerins

[57] ABSTRACT

A layered structure formed on a substrate comprising an oxide superconductor thin film deposited on the substrate, a noble metal monolayer deposited on the oxide superconductor thin film and an insulator thin film deposited on the noble metal monolayer. The noble metal monolayer prevents interdiffusion between the oxide superconductor thin film and the insulator thin film so that they have excellent properties.

10 Claims, 2 Drawing Sheets

FIGURE 2A

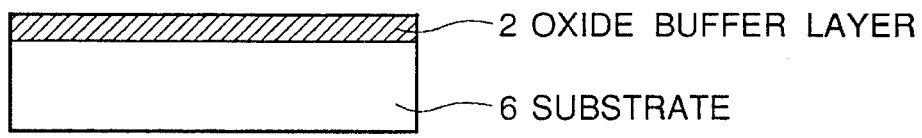

- 2 OXIDE BUFFER LAYER
- 6 SUBSTRATE

FIGURE 2B

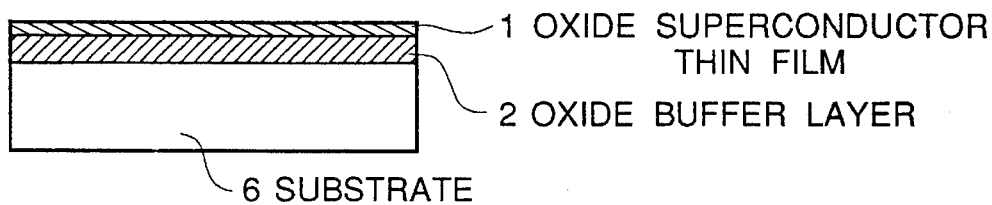

- 1 OXIDE SUPERCONDUCTOR THIN FILM
- 2 OXIDE BUFFER LAYER
- 6 SUBSTRATE

FIGURE 2C

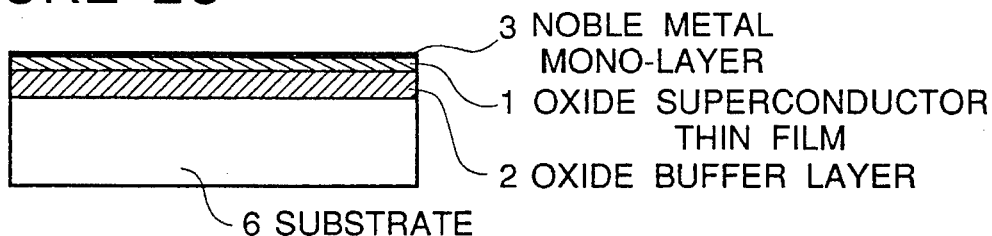

- 3 NOBLE METAL MONO-LAYER
- 1 OXIDE SUPERCONDUCTOR THIN FILM
- 2 OXIDE BUFFER LAYER
- 6 SUBSTRATE

FIGURE 2D

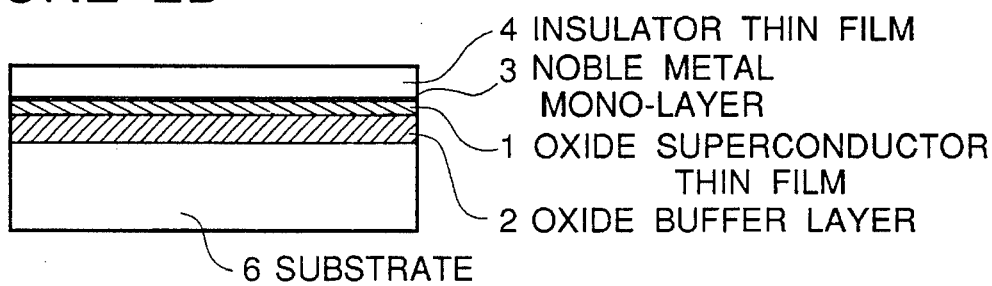

- 4 INSULATOR THIN FILM
- 3 NOBLE METAL MONO-LAYER
- 1 OXIDE SUPERCONDUCTOR THIN FILM
- 2 OXIDE BUFFER LAYER
- 6 SUBSTRATE

FIGURE 2E

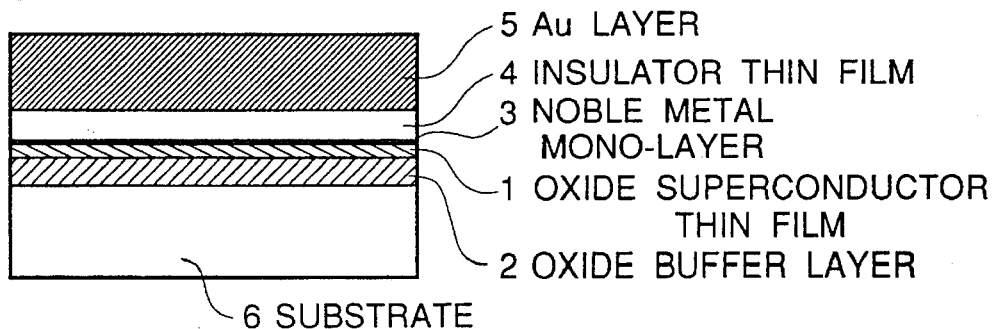

- 5 Au LAYER
- 4 INSULATOR THIN FILM
- 3 NOBLE METAL MONO-LAYER
- 1 OXIDE SUPERCONDUCTOR THIN FILM
- 2 OXIDE BUFFER LAYER
- 6 SUBSTRATE

LAYERED STRUCTURE COMPRISING INSULATOR THIN FILM AND OXIDE SUPERCONDUCTOR THIN FILM

BACKGROUND OF THE INVENTION

1. Field of the Invention

The present invention relates to a layered structure comprising an insulator thin film and an oxide superconductor thin film, more specifically, to a layered structure comprising an insulator thin film and an oxide superconductor thin film with a little interdiffusion at an interface between those two thin films.

2. Description of Related Art

Oxide superconductors which have been recently advanced in study have higher critical temperatures than those of metallic superconductors, so that they are more applicable for practical usage. For example, Y—Ba—Cu—O type oxide superconductor has a critical temperature higher than 80 K and it is announced that Bi—Sr—Ca—Cu—O type oxide superconductor and Tl—Ba—Ca—Cu—O type oxide superconductor have critical temperatures higher than 100 K.

In order to apply the oxide superconductors to superconducting devices, it is necessary to make oxide superconductors in a form of thin films. The term thin films means films, having a thickness of from $10^{-1}$ nanometers to on the order of 10 μm, artificially deposited on substrates. The oxide superconductor thin films are usually deposited on single crystal substrates, for example a MgO substrate, a $SrTiO_3$ substrate, a YSZ (yttrium stabilized zirconia) substrate, etc., by various methods such as a sputtering, an MBE (molecular beam epitaxy), a reactive co-evaporation, a CVD (chemical vapor deposition). The oxide superconductor thin films grow epitaxially on these substrate.

It is also necessary to deposit other thin films on the oxide superconductor thin films in order to manufacture some types of superconducting devices. For example, a tunnel type Josephson junction comprises a layered structure of a first superconducting layer, an thin insulator layer and a second superconducting layer stacked in the named order. Therefore, if an oxide superconductor is applied to the tunnel type Josephson junction device, a first oxide superconductor thin film, an insulator thin film and a second oxide superconductor thin film should be stacked in the named order.

A superconducting field effect device, a candidate of realistic three-terminal superconducting devices, has a superconducting channel and a gate electrode formed on the superconducting channel through a gate insulator layer. If a superconducting field effect device is manufactured by using an oxide superconductor, it is necessary to stack an oxide superconductor thin film, an insulator thin film and a normal conductor film in the named order.

In addition, in order to fabricate a superconducting multilayer wiring structure by using an oxide superconductor, oxide superconducting thin films and insulator thin films should be alternately stacked.

All of above superconducting devices and elements require high quality thin films. Namely, oxide superconductor thin films and other thin films preferably should have excellent properties originated by their high crystallinity. It is more preferable that the thin films are formed of single crystals. If one of the thin films is polycrystalline or amorphous, the device or the element may have degraded characteristics or may not even operate.

Additionally, in the above superconducting devices and elements, interfaces between the two different thin films are also important. It is preferable that there is no interdiffusion through the interfaces, therefore, there should exist clear boundary planes. In particular, if constituent elements of the nonsuperconductor thin films diffuse into the oxide superconductor thin films, superconducting properties of the oxide superconductor thin films are fairly degraded, and vice versa.

In a prior art, all the thin films consisting of the layered structure are deposited by using the same apparatus in order to prepare a layered structure having clear interfaces. For example, in case of reactive co-evaporation using Knudsen cell (K cell) evaporation sources, an oxide superconductor thin film is deposited on a substrate at first, and then, the other evaporation sources are used so as to deposit an insulator thin film on the oxide superconductor thin film successively. A surface of the oxide superconductor thin film, namely an interface between the oxide superconductor thin film and the insulator thin film, is not exposed to the air so as to be prevented from contamination and degradation.

However, during the above process, the insulator thin film should be deposited at a suitable substrate temperature for forming a highly crystallized and, therefore, high quality insulator thin film. At this relatively high substrate temperature, significant interdiffusion is caused at the interface, mainly because of its long deposition time. By this, both the oxide superconductor thin film and the insulator thin film are degraded so as to have poor qualities or properties.

If the insulator thin film is deposited at a lower substrate temperature in order to avoid the interdiffusion at the boundary plane, the insulator thin film is less crystalline or may be formed of amorphous so as to have degraded properties.

SUMMARY OF THE INVENTION

Accordingly, it is an object of the present invention to provide a layered structure comprising an insulator thin film and an oxide superconductor thin film, which have overcome the above mentioned detects of the conventional ones.

The above and other objects of the present invention are achieved in accordance with the present invention by a layered structure formed on a substrate comprising an oxide superconductor thin film deposited on the substrate, a noble metal monolayer deposited on the oxide superconductor thin film and an insulator thin film deposited on the noble metal monolayer.

The noble metal monolayer prevents interdiffusion between the oxide superconductor thin film and the insulator thin film. Therefore, the layered structure in accordance with the present invention has a clear boundary plane and no interdiffusion at the interface between the two films.

According to the present invention, the noble metal monolayer must be used. A crystalline noble metal layer (thicker than monolayer), even if it is extremely thin, deposited on the oxide superconductor thin film has an periodic lattice structure of inherent lattice parameters which are different from those of the oxide superconductor and those of the insulator. Therefore, an insulator thin film deposited on the thick noble metal layer can not be epitaxially grown so as to be less crystalline so that its properties are degraded.

On the other hand, the noble metal monolayer has less ability to affect a lattice structure of a thin film growing on it. Therefore, an insulator thin film deposited on the noble metal monolayer can be grown up to maintain its inherent lattice parameters, so that a crystalline and high quality insulator thin film can be obtained. For this purpose, a noble metal monolayer must be used in accordance with the present invention.

Preferably, the layered structure further comprising a buffer layer between the substrate and the superconductor thin film. The purpose of this buffer layer is to compensate lattice mismatch between the substrate and oxide superconductor and to prevent interdiffusion. For example, the buffer layer is formed of $Pr_1Ba_2Cu_3O_{7-y}$ oxide. $Pr_1Ba_2Cu_3O_{7-y}$ oxide has a crystal structure similar to that of $Y_1Ba_2Cu_3O_{7-x}$ oxide superconductor so that the buffer layer of $Pr_1Ba_2Cu_3O_{7-y}$ oxide can compensate lattice mismatch between the substrate and the $Y_1Ba_2Cu_3O_{7-x}$ oxide superconductor thin film. In addition, the buffer layer prevents interdiffusion between them. Even if constituent elements of $Pr_1Ba_2Cu_3O_{7-y}$ oxide buffer layer diffuse into the $Y_1Ba_2Cu_3O_{7-x}$ oxide superconductor thin film, properties of the oxide superconductor thin film are not affected.

In a preferred embodiment, the oxide thin film is formed of high-$T_c$ (high critical temperature) oxide superconductor, particularly, formed of a high-$T_c$ copper-oxide type compound oxide superconductor, for example, a Y—Ba—Cu—O compound oxide superconductor material, a Bi—Sr—Ca—Cu—O compound oxide superconductor material, and a Tl—Ba—Ca—Cu—O compound oxide superconductor material.

In addition, the substrate can be formed of an insulating substrate, preferably an oxide single crystalline substrate such as MgO, $SrTiO_3$, $CdNdAlO_4$, etc. These substrate materials are very effective in forming or growing a crystalline film on them.

The above and other objects, features and advantages of the present invention will be apparent from the following description of preferred embodiments of the invention with reference to the accompanying drawings.

BRIEF DESCRIPTION OF THE DRAWINGS

FIGS. 2A to 2E are diagrammatic sectional views illustrating a process for manufacturing the layered structure in accordance with the present invention.

DESCRIPTION OF THE PREFERRED EMBODIMENTS

Figure 1:
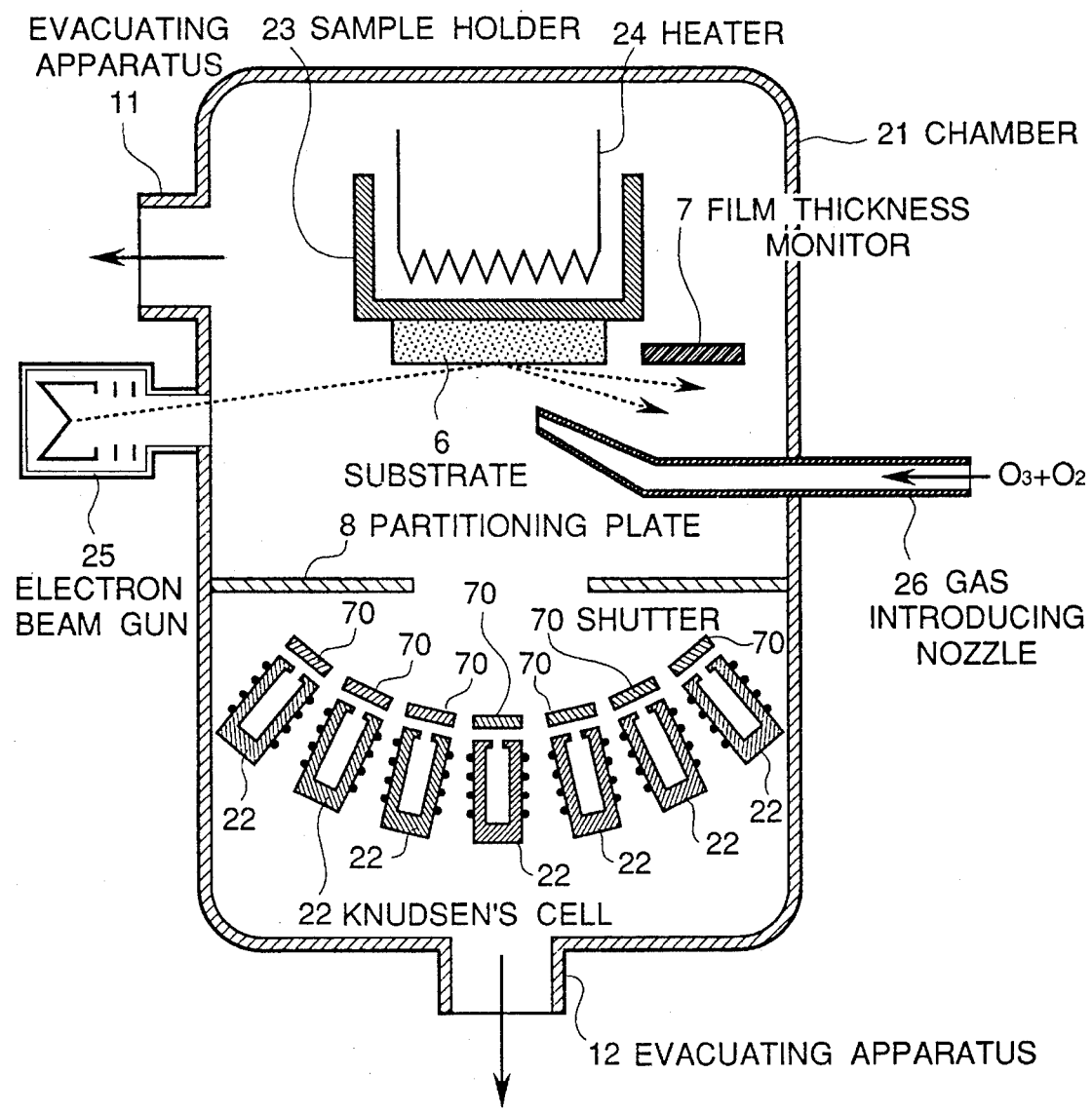
FIG. 1 is a diagrammatic sectional view of a film deposition apparatus which can be used for manufacturing the layered structure in accordance with the present invention.

Referring to FIG. 1 there is shown a diagrammatic sectional view of a film deposition apparatus which can be used for conducting the process in accordance with the present invention.

This film deposition apparatus includes a vacuum chamber 21 provided with evacuating apparatuses 11 and 12, seven K cells 22 having controllable shutters 70 provided at the bottom of the vacuum chamber 21, and a sample holder 23 provided at the top of the vacuum chamber 21 for holding a substrate 6 on which a film is to be deposited. Shutters 70 and temperatures of the K cells 22 are independently controlled so that the amount of molecular beam flux of each material and deposition rate of compound films are independently controlled. The sample holder 23 is contacted to a heater 24 for heating the substrate and a thermocouple (not shown). A film thickness monitor 7 is provided near the sample holder 23. In addition, the vacuum chamber 21 also has an electron beam gun 25 of Reflecting High Energy Electron Diffraction (RHEED) measurement for observing roughness and crystallinity of a thin film even during the deposition. Though not shown, a liquid nitrogen shroud for cooling outer shells of the K cells 22.

Additionally, a gas introducing nozzle 26 is provided so as to introduce an oxidizing gas such as $O_2$, $O_3$, $NO_2$, $N_2O$, etc. to the vicinity of the substrate 6 attached to the sample holder 23, so that the oxidizing gas can be supplied to form an oxygen-enriched atmosphere in the vicinity of the substrate 6 in order to oxidize metal molecular beams supplied from the evaporation sources in the course of the film deposition.

Furthermore, the film deposition apparatus additionally includes a partitioning plate 8 for dividing the vacuum chamber 1 into a bottom sub-chamber which consists of a lower portion of the vacuum chamber defined below the partitioning plate 8, which has the K cells 22 and the main evacuating apparatus 12, and a top sub-chamber which consists of an upper portion of the vacuum chamber defined above the partitioning plate 8 and in which sample holder 3 is located. The partitioning plate 8 includes a round shape opening formed at a center thereof. The position of the opening is determined to ensure that molecular beams emitted from K cells toward the substrate 6 are not obstructed by the partitioning plate 8. In addition, the size of the opening is determined to enable restricted oxygen leakage from the top sub-chamber to the bottom sub-chamber so that a pressure difference can be created between these two sub-chambers. Therefore, the partitioning plate 8 having the round shape opening acts as a vacuum conductance.

In addition, the evacuating apparatus 11 is connected to the top sub-chamber for evacuating the top sub-chamber to an ultra-high vacuum. The auxiliary evacuating apparatus 11 is constituted of a cryopump. On the other hand, the evacuating apparatus 12 is constituted of a diffusion or turbo pumps.

Referring to FIGS. 2A to 2E, a process for forming the layered structure in accordance with the present invention will be described.

As shown in FIG. 2A, an oxide buffer layer 2 of $Pr_1Ba_2Cu_3O_{7-y}$ having a thickness of 30 nanometers was deposited on a $SrTiO_3$ single crystalline substrate 6 by reactive co-evaporation method. At first, $SrTiO_3$ (100) substrate 6 was attached to the sample holder 23, and metal praseodymium, metal yttrium, metal barium, copper, metal strontium, metal titanium and Au were put into tantalum crucibles held within the seven K cells 20 used as evaporation sources. Thereafter, inlets of the chamber 1 were closed and evacuation process by the evacuating apparatuses 11 and 12 began to reach an ultra-high vacuum which obtained a pressure lower than $1 \times 10^{-10}$ Torr, which was required to the background pressure during the film deposition by the MBE process. Succeedingly, an oxidizing gas of $O_2$ including more than 70 volume percent $O_3$ was supplied from the gas introducing nozzle 26 so that the oxidation gas partial pressure around the substrate 6 became $5 \times 10^{-6}$ Torr.

As mentioned above, the vacuum chamber 1 was provided with the vacuum conductance (the partitioning plate 8), a pressure difference of about one digit or more was created between the bottom sub-chamber and the top sub-chamber. Oxidation gas partial pressure of the bottom sub-chamber was maintained low enough to prevent the evaporation sources from oxidization and to maintain the metal molecular beams from each evaporation source during the deposition. In addition, the oxidizing gas injected from the gas introducing nozzle 6 was supplied onto a specimen surface, the partial pressure of the oxidizing gas on the deposition plane of the specimen was maintained enough amount for the oxide film formation.

Then, the substrate 6 was heated by the heater 4 to a temperature of 650° C. The K cell 22 of metal praseodymium was heated to a temperature of 920° C., the K cell 22 of metal barium was heated to a temperature of 620° C. and the K cell 22 of metal copper was heated to a temperature of 1000° C. The temperatures of the K cells are determined by the amount of metal molecular beam fluxes requested by the arrangement of the MBE apparatus and oxide composition.

When molecular beams had reached to their stable operation, the shutters 70 were opened so as to start deposition of the $Pr_1Ba_2Cu_3O_{7-y}$ oxide thin film onto the substrate 6. At the same time, surface crystallinity of this deposited film surface was observed by the RHEED device.

Then, all the shutters 70 of the K cells 22 were closed and the K cell 22 of metal yttrium was heated to a temperature of 1220° C. At the same time, the substrate temperature was raised to 700° C. Other conditions were kept the same. When molecular beams had reached to their stable operation, again, the shutters 70 of the K cells 22 of yttrium, barium and copper were opened so as to start deposition of a $Y_1Ba_2Cu_3O_{7-x}$ (0<x<1) oxide superconductor thin film 1 onto the $Pr_1Ba_2Cu_3O_{7-y}$ oxide buffer layer 2, as shown FIG. 2B. At the same time, surface crystallinity of this deposited film was observed by the RHEED device.

$Pr_1Ba_2Cu_3O_{7-y}$ oxide has a crystal structure similar to that of $Y_1Ba_2Cu_3O_{7-x}$ (0<x<1) oxide superconductor so that the oxide buffer layer 2 of $Pr_1Ba_2Cu_3O_{7-y}$ oxide moderates lattice mismatch between the $SrTiO_3$ substrate and the $Y_1Ba_2Cu_3O_{7-x}$ oxide superconductor thin film 1. In addition, the buffer layer 2 prevents interdiffusion between them. Even if constituent elements of $Pr_1Ba_2Cu_3O_{7-y}$ oxide buffer layer 2 diffuse into the $Y_1Ba_2Cu_3O_{7-x}$ oxide superconductor thin film 1, properties of the oxide superconductor thin film I are not affected.

When the $Y_1Ba_2Cu_3O_{7-x}$ oxide superconductor thin film 1 was grown up to have a thickness of 10 nanometers, all the shutters 70 of the K cells 22 were closed and the K cell 22 of Au was heated up to a temperature of 500° C. At the same time, the oxidizing gas was stopped so that the chamber 21 was evacuated to a pressure of $1 \times 10^{-9}$ Torr. After Au molecular beam had reached to its stable operation, the shutter 70 of the K cell 22 of Au was opened so as to start deposition of an Au monolayer 3 onto the $Y_1Ba_2Cu_3O_{7-x}$ oxide superconductor thin film 1 at the substrate temperature of 700° C. as shown FIG. 2C. The monolayer 3 can be formed of a noble metal which does not react with the oxide superconductor, for example Au, Ag, Pt. If Pt is used as the noble metal monolayer 3, an electron beam gun is used as deposition source instead of a K cell.

Thereafter, the shutter 70 of Au K cell 22 was closed and the K cell 22 of metal strontium was heated to a temperature of 520° C. and the K cell 22 of metal titanium was heated to a temperature of 1500 ° C. In addition, an oxidizing gas of $O_2$ including more than 70 volume percent $O_3$ was again supplied from the gas introducing nozzle 26 so that the pressure around the substrate 6 became $5 \times 10^{-6}$ Torr. When molecular beams had reached to their stable operation, the shutters 70 were opened so as to start deposition of the $SrTiO_3$ insulator thin film 4 having a thickness of 50 nanometers onto the Au monolayer 3, as shown in FIG. 2D. The substrate temperature was kept 500° C. The insulator layer can be formed of $SrTiO_3$, MgO or silicon nitride.

In situ observation with the RHEED device made it clear that the $SrTiO_3$ insulator thin film 4 was deposited sequentially, which was formed of a $SrTiO_3$ single crystal, and had an uniform thickness.

Then, all the shutters 70 were closed again and the K cell 22 of Au was heated to a temperature of 500° C. At the same time, the oxidizing gas was stopped so that the chamber 21 was evacuated to a pressure of $3 \times 10^{-10}$ Torr. After Au molecular beam had reached to its stable operation, the shutter 70 of the K cell 22 of Au was opened so as to start deposition of an Au layer 5 having a thickness of 200 nanometers onto the $SrTiO_3$ insulator thin film 4 at a substrate temperature of 500° C., as shown in FIG. 2E.

In situ observation with the RHEED device made it clear that the Au thin film 5 was grown to satisfy a single crystalline condition After the layered structures of the $Pr_1Ba_2Cu_3O_{7-y}$ oxide buffer layer 2, $Y_1Ba_2Cu_3O_{7-x}$ oxide superconductor thin film 1, Au monolayer 3, $SrTiO_3$ thin film 4 and Au layer 5 were obtained, crystal structures and conditions of the interface were evaluated by SEM, LEED and XPS without exposing the layered structure to the air. It became clear that the $Y_1Ba_2Cu_3O_{7-x}$ oxide superconductor thin film 1, the $SrTiO_3$ thin film 4 and Au layers 3 and 5 were foraged of single crystals and the interfaces between them were sharply formed with little interdiffusion. Therefore, the layered structures had a small amount of interface states. By this, it was favorable that a gate structure of a superconducting field effect device was formed by the method in accordance with the present invention.

In the above process, if the seven K cells can not be set in one chamber, it is possible to use an apparatus comprising equal to or more than two chambers and in situ sample transfer device connecting the chambers.

In addition, the layered structure according to the present invention can be applied to a structure having a thin film of an arbitrary material deposited on a thin film of an oxide superconductor.

Furthermore, the oxide superconductor thin film can be formed of a high-$T_c$ (high critical temperature) oxide superconductor material, particularly a high-$T_c$ copper-oxide type compound oxide superconductor material, for example a Ln—Ba—Cu—O (Ln means a lanthanoide) compound oxide superconductor material, a Bi—Sr—Ca—Cu—O compound oxide superconductor material, and a Tl—Ba—Ca—Cu—O compound oxide superconductor material other than $Y_1Ba_2Cu_3O_{7-x}$ oxide superconductor material.

The thin film deposited on the oxide superconductor thin film can be formed of an arbitrary material different from the oxide superconductor, for example, an insulator such as $SrTiO_3$, MgO, silicon nitride, a semiconductor, an oxide superconductor, an oxide such as $Pr_1Ba_2Cu_3O_{7-y}$ etc.

The substrate can be formed of for example, an insulator substrate such as a MgO (100) substrate, a $SrTiO_3$ (100) substrate, a $CdNdAlO_4$ (001) substrate or others.

The invention has thus been shown and described with reference to the specific embodiments. However, it should be noted that the present invention is in no way limited to the details of the illustrated structures but converts and modifications may be made within the scope of the appended claims.

We claim:

1. A layered structure comprising:
   a substrate;
   an oxide superconductor thin film disposed on said substrate;

a noble metal monolayer disposed on said oxide superconductor thin film; and an insulator thin film disposed on said noble metal monolayer.

2. The layered structure as claimed in claim 1, further comprising a buffer layer disposed between the substrate and the oxide superconductor thin film.

3. The layered structure as claimed in claim 2, wherein said buffer layer is formed of $Pr_1Ba_2Cu_3O_{7-x}$.

4. The layered structure as claimed in claim 1, further comprising a normal conductor layer disposed on said insulator thin film.

5. The layered structure as claimed in claim 4, wherein said layered structure forms a gate structure of a superconducting field effect device comprising a superconducting channel of an oxide superconductor and a gate electrode arranged on the superconducting channel through a gate insulator layer.

6. The layered structure as claimed in claim 1, wherein said oxide superconductor thin film is formed of high-$T_c$ (high critical temperature) oxide superconductor, particularly, formed of a high-$T_c$ copper-oxide type compound oxide superconductor.

7. The layered structure as claimed in claim 6, wherein said oxide superconductor thin film is formed of oxide superconductor material selected from the group consisting of a Y—Ba—Cu—O compound oxide superconductor material, a Bi—Sr—Ca—Cu—O compound oxide superconductor material, and a Tl—Ba—Ca—Cu—O compound oxide superconductor material.

8. The layered structure as claimed in claim 1, wherein said insulator is selected from the group consisting of $SrTiO_3$, MgO and silicon nitride.

9. The layered structure as claimed in claim 1, wherein said substrate is formed of an insulator.

10. The layered structure as claimed in claim 8, wherein said substrate is formed of a material selected from the group consisting of a MgO (100) substrate, a $SrTiO_3$ (100) substrate and a $CdNdAlO_4$ (001) substrate.

* * * * *

UNITED STATES PATENT AND TRADEMARK OFFICE
CERTIFICATE OF CORRECTION

PATENT NO. :     5,480,861
DATED      :     Jan. 2, 1996
INVENTOR(S) :    TANAKA et al.

It is certified that error appears in the above-indentified patent and that said Letters Patent is hereby corrected as shown below:

Col. 8, Line 16, (Claim 10, Line 1) "8" should be -- 9 --.

Signed and Sealed this

Sixth Day of August, 1996

Attest:

BRUCE LEHMAN

*Attesting Officer*     Commissioner of Patents and Trademarks